United States Patent
Ikushima

(10) Patent No.: US 8,034,194 B2
(45) Date of Patent: Oct. 11, 2011

(54) PALLET FOR FIXING WORK AND LIQUID APPLYING APPARATUS PROVIDED WITH SAME

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 316 days.

(21) Appl. No.: 12/278,044

(22) PCT Filed: Feb. 1, 2007

(86) PCT No.: PCT/JP2007/051675
§ 371 (c)(1), (2), (4) Date: Nov. 19, 2008

(87) PCT Pub. No.: WO2007/088921
PCT Pub. Date: Aug. 9, 2007

(65) Prior Publication Data
US 2009/0205688 A1      Aug. 20, 2009

(30) Foreign Application Priority Data
Feb. 2, 2006 (JP) .................................. 2006-025292

(51) Int. Cl.
*B08B 3/04* (2006.01)

(52) U.S. Cl. ................. 134/166 R; 134/167 R; 134/172; 422/503

(58) Field of Classification Search .............. 134/166 R, 134/167 R, 172; 422/503
See application file for complete search history.

(56) References Cited

U.S. PATENT DOCUMENTS

| | | | | |
|---|---|---|---|---|
| 3,551,062 A | * | 12/1970 | Brown | 356/246 |
| 4,478,094 A | * | 10/1984 | Salomaa et al. | 73/863.32 |
| 4,727,033 A | * | 2/1988 | Hijikata et al. | 436/69 |
| 4,919,894 A | * | 4/1990 | Daniel | 422/561 |
| 5,281,516 A | * | 1/1994 | Stapleton et al. | 435/3 |
| 5,306,510 A | * | 4/1994 | Meltzer | 422/65 |
| 5,343,273 A | * | 8/1994 | Yamamoto et al. | 355/75 |
| 5,443,791 A | * | 8/1995 | Cathcart et al. | 422/65 |

(Continued)

FOREIGN PATENT DOCUMENTS

JP       06-209040 A       7/1994

(Continued)

OTHER PUBLICATIONS

WIPO WO 02/34944 May 2002.*

(Continued)

*Primary Examiner* — Frankie L Stinson
(74) *Attorney, Agent, or Firm* — Westerman, Hattori, Daniels & Adrian, LLP

(57) ABSTRACT

[Object] To provide a pallet capable of reliably holding a board-like work on a table and applying a liquid to a desired position on an upper surface of the work, and to provide an applying apparatus provided with the pallet. [Solving Means] A pallet for fixing a board-like work is arranged on a table of a liquid applying apparatus, which applies a liquid by moving a nozzle for discharging the liquid and the table relatively to each other. The pallet comprises a base having a work area in which a plurality of works are arranged in parallel in a row direction and/or a column direction, and a holding plate for holding the work at both ends thereof, the holding plate having a window (69) which is positioned to make open central portion of the works arranged in the work area.

20 Claims, 3 Drawing Sheets

U.S. PATENT DOCUMENTS

| | | | |
|---|---|---|---|
| 5,591,646 A * | 1/1997 | Hudson et al. | 506/9 |
| 5,866,825 A * | 2/1999 | Moore et al. | 73/864.22 |
| 5,988,236 A * | 11/1999 | Fawcett | 141/130 |
| 6,043,880 A * | 3/2000 | Andrews et al. | 356/311 |
| 6,063,339 A * | 5/2000 | Tisone et al. | 422/67 |
| 6,240,984 B1 * | 6/2001 | Fawcett et al. | 141/130 |
| 6,436,351 B1 * | 8/2002 | Gubernator et al. | 422/553 |
| 7,329,393 B2 * | 2/2008 | Backes et al. | 422/552 |
| 7,610,941 B2 * | 11/2009 | Kubacki | 141/8 |
| 7,713,487 B1 * | 5/2010 | Locklear et al. | 422/501 |
| 2002/0104583 A1 * | 8/2002 | Andersson | 141/145 |
| 2002/0146345 A1 * | 10/2002 | Neilson et al. | 422/51 |
| 2003/0045000 A1 * | 3/2003 | Frank et al. | 436/180 |
| 2003/0155034 A1 * | 8/2003 | De Beukeleer et al. | 141/130 |
| 2005/0172900 A1 | 8/2005 | Chang | |
| 2006/0180489 A1 * | 8/2006 | Guiney et al. | 206/456 |
| 2010/0218620 A1 * | 9/2010 | Hoyer et al. | 73/863.11 |

FOREIGN PATENT DOCUMENTS

| | | | |
|---|---|---|---|
| JP | 8-372225 A | | 2/1996 |
| JP | 2002-353302 A | | 12/2002 |
| JP | 2004-512514 A | | 4/2004 |
| JP | 2005-224798 A | | 8/2005 |
| JP | 2005-300291 | * | 10/2005 |
| JP | 2005-300291 A | | 10/2005 |
| JP | 2005300291 | * | 10/2005 |
| JP | 2005-340701 A | | 12/2005 |
| WO | WO 02/34944 A1 | | 5/2002 |

OTHER PUBLICATIONS

International Search Report of PCT/JP2007/051675, date of mailing May 15, 2007.

* cited by examiner

[Fig.1]
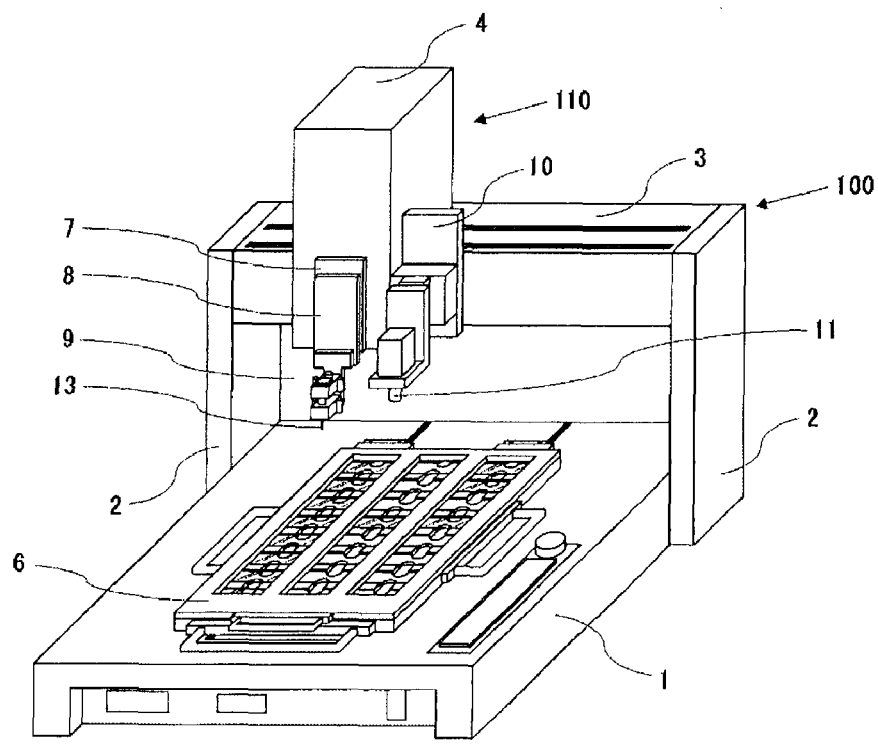
[Fig.2]
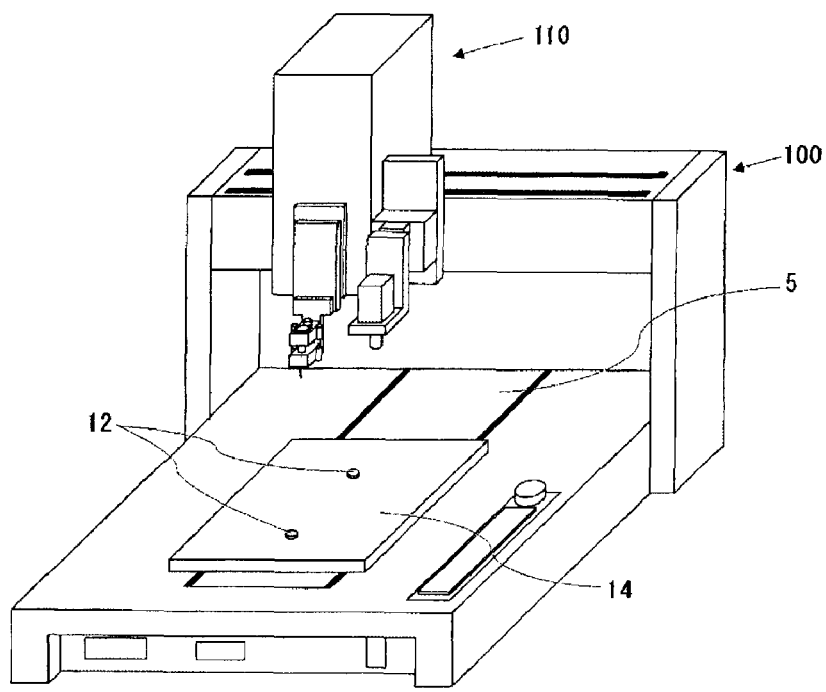

[Fig.3]
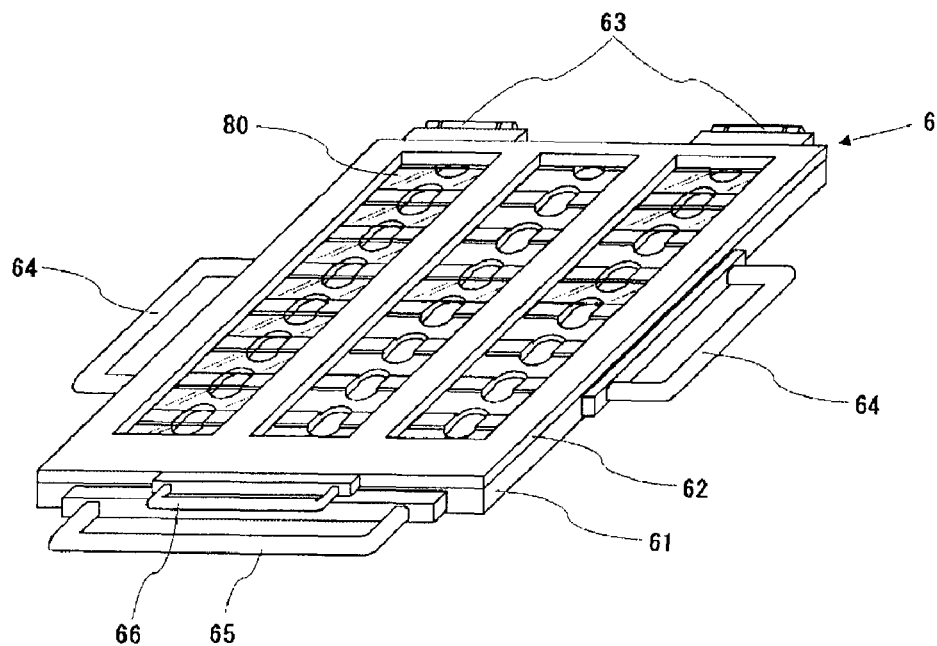
[Fig.4]
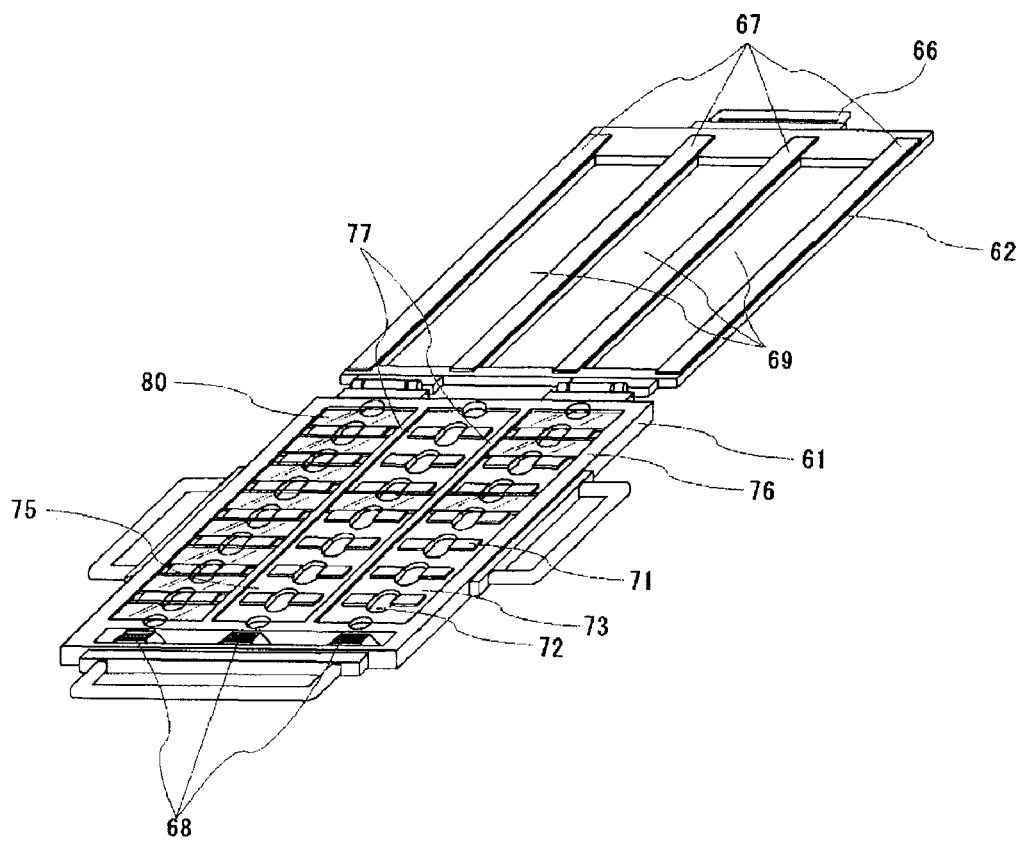

[Fig.5]
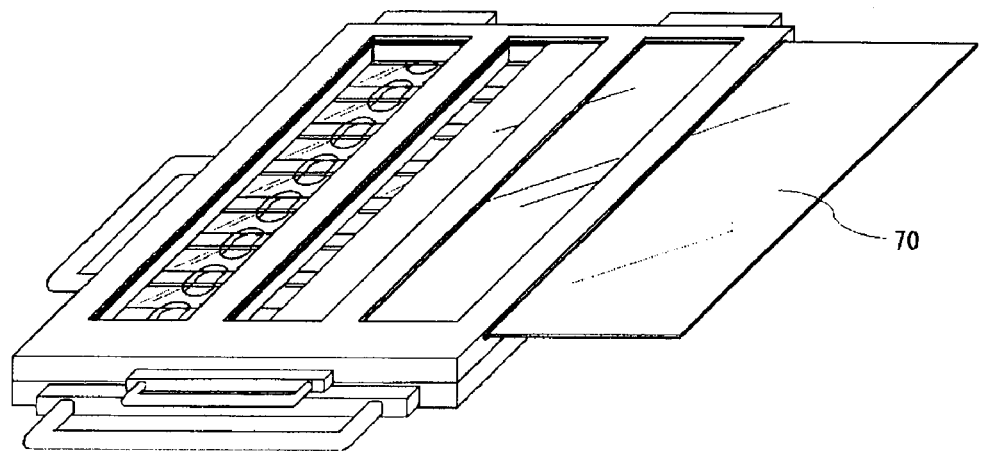
[Fig.6]
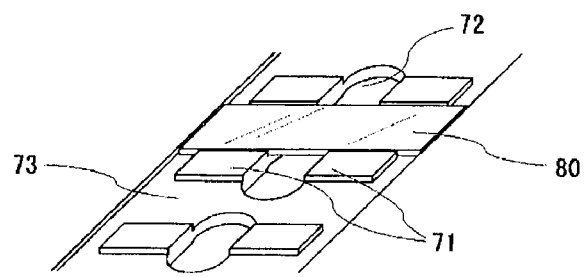

PALLET FOR FIXING WORK AND LIQUID APPLYING APPARATUS PROVIDED WITH SAME

TECHNICAL FIELD

The present invention relates to an apparatus for applying liquids, which include a low-viscosity material such as water or alcohol, a high-consistency fluid, such as a pasty or creamy industrial material, and a fluid such as a reagent, protein or a biological sample, to a desired position on an upper surface of a board-like work. The present invention also relates to a pallet for fixing the work in the liquid applying apparatus.

BACKGROUND ART

As one example of apparatus for arranging a plurality of board-like works on a table and applying a liquid onto each of the works, there is known an apparatus (arrayer) disclosed in Patent Document 1.

The apparatus disclosed in Patent Document 1 relates to a biochip arrayer and includes a separable board fixing base having a plurality of board fixing grooves in which fixing ends, fixing projections, and aligning bosses are formed such that biochips can be closely inserted in the board fixing grooves.

Also, the board fixing groove holds the board at both lateral sides thereof, as shown in FIGS. 6A to 6F of the cited Patent Document 1.

Thus, the biochip board is fixed in place by holding the board at both lateral sides thereof in the fixing groove which is formed in plural number in the separable fixing base.
Patent Document 1: PCT Japanese Patent Translation Publication No. 2004-512514

DISCLOSURE OF THE INVENTION

Problems to be Solved by the Invention

However, the method of fixing the board by holding the board at both lateral sides thereof in the fixing groove is disadvantageous in that when the board fixing base is inclined in, e.g., operations of attaching and detaching the board fixing base, the board may be disengaged from the fixing groove, or the board may be slipped off from the board fixing base and damaged in some cases.

Further, in performing an applying operation with the fixing base disposed on a movable table, when the table is moved at a high speed, the board held at its lateral sides in the board fixing groove may slightly float or sink up and down, thus causing the so-called fluttering.

The present invention has been made in view of the above-described situations in the art, and its object is to provide a pallet capable of reliably holding a board-like work on a table and applying a liquid to a desired position on an upper surface of the work, and to provide an applying apparatus provided with the pallet.

Means for Solving the Problems

To solve the above-described problems and to achieve the object, the pallet and the liquid applying apparatus according to the present invention are constituted as follows.

According to a first aspect, the present invention provides a pallet for fixing a board-like work, the pallet being arranged on a table of a liquid applying apparatus, which applies a liquid by moving a nozzle for discharging the liquid and the table relatively to each other, wherein the pallet comprises a base having a work area in which a plurality of works are arranged in parallel in a row direction and/or a column direction, and a holding plate for holding the work at both ends thereof, the holding plate having a window (69) which is positioned to make open central portion of the works arranged in the work area.

According to a second aspect, in the first aspect of the present invention, the work area is made up of plural rows, and the base has projections formed to project upward from a surface of the base, on which the work is placed, for partition between the rows of the work area, and an interval between the projections is slightly larger than a short side of the work.

According to a third aspect, in the first or second aspect of the present invention, the work area is made up of plural columns, and the base has column partitioning ribs formed to project upward from the surface of the base, on which the work is placed, for partition between the columns of the work area, and an interval between the ribs is slightly larger than a long side of the work.

According to a fourth aspect, in the first, second or third aspect of the present invention, between two projections which are located adjacent to one work, a recess is formed to be hollowed to a lower level than the surface of the base, on which the work is placed, and a length of the recess in the column direction is larger than a side of the projection in the column direction.

According to a fifth aspect, in any one of the first to fourth aspects of the present invention, a surface of the holding plate, which is brought into contact with both the ends of the work, is formed of an elastic member.

According to a sixth aspect, in any one of the first to fifth aspects of the present invention, a cover covering the works placed in the work area is detachably attached to the base.

According to a seventh aspect, in any one of the first to sixth aspects of the present invention, the base includes a magnet disposed in a surface thereof, which is brought into contact with the holding plate, and the holding plate is made of a metal having magnetic action or includes a magnet disposed at a position opposed to the magnet in the base.

According to an eighth aspect, in any one of the first to seventh aspects of the present invention, the pallet has a positioning hole formed in a rear surface thereof and is demountably mounted to a predetermined position on the table of the liquid applying apparatus.

According to a ninth aspect, the present invention provides a liquid applying apparatus including a table provided with a positioning pin which is fitted to the positioning hole formed in the rear surface of the pallet according to the eighth aspect.

According to a tenth aspect, the present invention provides a liquid applying apparatus including a table to which the pallet according to any one of the first to seventh aspects is fixed.

Effect of the Invention

With the present invention, since the board-like work can be reliably held, the work can be prevented from causing the so-called fluttering, and the liquid can be applied to a desired position with high accuracy.

Also, since the board-like work can be reliably held, an applying operation can be performed while moving the table at a high speed, and a time required for the applying operation can be reduced.

Since fixing means for holding the work at its ends from upper and lower surfaces thereof to fix the work in place is provided on the pallet which can be easily attached to and detached from the table, the work can be prevented from slipping off during the operation of attaching and detaching the pallet.

Further, since the pallet is provided with the cover, it is possible to protect the work before it is set in the applying apparatus.

BRIEF DESCRIPTION OF THE DRAWINGS

FIG. 1 is an external perspective view of an applying apparatus according to Embodiment 1.

FIG. 2 is an external perspective view of the applying apparatus according to Embodiment 1 when a pallet is not mounted.

FIG. 3 is an enlarged external perspective view of the pallet in the applying apparatus according to Embodiment 1.

FIG. 4 is an external perspective view of the pallet, shown in FIG. 3, when a holding plate is at an open position to attach or detach the work to or from the pallet.

FIG. 5 is an external perspective view of the pallet when a cover is mounted.

FIG. 6 is an enlarged perspective view of a work area.

DESCRIPTION OF REFERENCE CHARACTERS 1 base member
2 post
3 X-axis moving means
4 Z-axis moving means
5 Y-axis moving means
6 pallet
7 Z-axis base
8 slider
9 head
10 mount plate
11 CCD camera
12 positioning pin
13 nozzle
14 table
61 pallet base
62 holding plate
63 hinge
64 grip A
65 grip B
66 grip C
67 elastic member
68 magnet
69 window
70 cover
71 projection
72 recess
73 base surface
74 rib
75 work area
76 outer edge member
77 column partitioning rib
80 work
100 body
110 head

BEST MODE FOR CARRYING OUT THE INVENTION

Details of the present invention will be described below in connection with an embodiment, but the present invention is in no way restricted by the following embodiment.

Embodiment

One embodiment of the present invention will be described with reference to FIGS. 1 through 5.

<<Structure>>

As shown in FIGS. 1 and 2, an applying apparatus according to the embodiment mainly comprises a body 100, which includes a base member 1, two posts 2 extending upward from the base member 1, an X-axis moving means 3 supported by the two posts 2, and a Y-axis moving means 5 disposed on an upper surface of the base member 1, a head 110 which is movable by the X-axis moving means 3 in the X-axis direction, and a pallet 6 which is mounted onto a table 14 provided on the Y-axis moving means 5.

The head 110 comprises a Z-axis moving means 4, a Z-axis base 7, a slider 8 capable of freely sliding on the Z-axis base 7 in the vertical (up-and-down) direction, a nozzle 13 disposed in a lower portion of the slider 8 and having a discharge port to discharge a liquid, an X-axis moving member (not shown) movable by the X-axis moving means 3 in the X-axis direction, and a mount plate 10 fixed to the X-axis moving member and provided with a CCD camera 11.

The head 110 includes a release mechanism that prevents the nozzle 13 from being damaged when the nozzle 13 and the work 80 contact with each other and an excessive load is exposed on the nozzle 13. More specifically, a slide base capable of smoothly sliding over a rail, which is disposed on the Z-axis base 7, is fixed to the slider 8. In other words, the release mechanism functions such that even when the nozzle 13 is further descended in the Z-axis direction after a distal end of the nozzle 13 has come into contact with the work 80, a body-side surface and a nozzle-side surface are allowed to smoothly slide relatively to each other.

A table 14 provided with positioning pins 12 is mounted to the Y-axis moving means 5, and it is movable in the Y-axis direction by the Y-axis moving means 5.

<<Structure of Pallet>>

As shown in FIGS. 3 and 4, a pallet base 61 and a holding plate 62 are connected to each other through hinges 63 such that the holding plate 62 is movable relative to the pallet base 61. A grip B 65 is attached to the pallet base 61, and a grip C 66 is attached to the holding plate 62. The holding plate 62 can be easily opened by lifting the grip C 66 upward while the grip B 65 is held stationary.

The pallet base 61 has a work area 75 of 3 columns and 8 rows, and therefore it can accommodate 24 works 80 at maximum. In the pallet base 61, outer edge members 76, column partitioning ribs 77 for partition between columns in the work area 75, and projections 71 for partition between rows in the work area 75 are formed extend upward from a base surface 73. The work 80 is placed between the projections 71 more specifically between them adjacently to two or four projections 71 (see FIG. 6). On the other hand, between the projections 71 to which one side of the work 80 is placed adjacently, a recess 72 is formed to be hollowed to a lower level than the base surface 73, as shown in FIG. 6, at a position corresponding to central portion of the works 80. With the presence of the recess 72, the work 80 placed in the work area 75 can be easily removed by grasping the work 80 at its lateral sides.

In the pallet base 61 thus constructed, by arranging the work 80 at a desired position in the work area, the work 80 is properly positioned such that two long sides of the work 80 are defined by the projections 71 and two short sides are defined by the column partitioning ribs 77 or the outer edge members 76.

After arranging the work 80 at the desired position, the holding plate 62 is closed so as to cover the pallet base 61.

Three magnets 68 are disposed in the pallet base 61 to firmly fix the pallet base 61 and the holding plate 62 together by magnetic action developed with the holding plate 62 itself which is made of a metal having magnetic action, or with magnets which are disposed in the holding plate 62 at positions opposite to the magnets 68 in the pallet base 61.

Three windows 69 are formed in the holding plate 62 such that, when the holding plate 62 is in its closed position with respect to the pallet base 61, a central portion of each column of the work area is exposed through the holding plate 62. Therefore, the liquid can be applied to an upper surface of the work 80.

Further, the holding plate 62 has ribs provided with elastic members 67. When the holding plate 62 is in its closed position with respect to the pallet base 61, the ribs of the holding plate 62 contact respectively the column partitioning ribs 77 on the pallet base, whereby the works 80 are fixed in place. More specifically, when the works are arranged on the pallet base 61 and the holding plate 62 is moved turn about the hinges 63 toward the closed position with respect to the pallet base 61, the elastic members 67 come into contact with ends of the works 80. When the holding plate 62 is further moved to approach the fully closed position, the ends of the works are held at upper and lower surfaces thereof by the action of the elastic members, whereby the works are reliably fixed in place.

The works 80 are placed on the base surface 73 of the pallet base 61, which is formed with high accuracy. Accordingly, even when the works 80 are pressed at their upper surfaces by the elastic members 67, the upper surfaces of the works 80 placed on the pallet 6 can be held at respective positions with satisfactory plane accuracy.

Additionally, in the state where the holding plate 62 is in its closed position with respect to the pallet base 61, the pallet 6 can be easily carried by grasping a grip A 64 with a hand.

<<Operation>>

The pallet 6 on which the works 80 have been set in advance is placed on the table 14. Positioning holes (not shown) formed in a rear surface of the pallet 6 in advance are fitted respectively to the positioning pins 12 projected on a front surface of the table 14, whereby the position of the pallet 6 on the table 14 is properly defined.

The X-axis moving means 4 and the Y-axis moving means 5 are operated to position the nozzle 13 at the desired position of the desired work. Thereafter, the Z-axis moving means 4 is descended to bring the nozzle 13 into contact with the work surface so that a liquid is applied from the nozzle to the work surface.

Herein, because the nozzle 13 includes the release mechanism, when the nozzle 13 is descended in the Z-axis direction in a state of the nozzle 13 contacting the work 80, the slide base is caused to smoothly move over the rail, to thereby prevent the nozzle 13 from further descending. Stated another way, since the slide base positioned at a lower end of the rail in an ordinary state, e.g., a standby state waiting for the start of an applying operation, is smoothly movable to ascend relatively, an excessive load is prevented from being imposed on the nozzle and the nozzle can be avoided from being damaged.

The liquid applied to the work is contained in the nozzle 13 or a reservoir (not shown) which is held in communication with the nozzle 13. Upon the nozzle 13 contacting the work surface as described above, part of the liquid contained in the nozzle or the reservoir is caused to move onto the work surface.

After applying the liquid to a plurality of points on the work surface by moving the X-axis moving means 4 and the Y-axis moving means 5 in the above-described manner, the X-axis moving means 4 and the Y-axis moving means 5 are successively moved so as to position the nozzle above another work for applying the liquid to the other the work.

At that time, the application sequence can be modified, as required, such that after applying a first liquid to surfaces of plural works, a nozzle containing the first liquid is replaced with a nozzle containing a second liquid, and the second liquid is applied to surfaces of other plural works.

After the application of the liquid to all the works 80 set on one pallet 6 is completed, that pallet 6 is removed from the table 14 and a new pallet including new works arranged thereon in advance is mounted to the table 14. The applying operation is repeated by the above procedure.

When the pallet including the works 80 arranged thereon in advance is in a state waiting for the applying operation, it is preferably stored in a place where dirt, dust and other foreign matters are kept minimum. To that end, as shown in FIG. 5, the holding plate can be modified such that a slit is formed in the holding plate and a cover 70 is inserted through the slit to keep clean the surfaces of the works arranged on the pallet. Further, the pallet capable of protecting the work surfaces from dirt, dust and other foreign matters with the insertion of the cover 70 can be stored in a stacked form. In addition, the pallet can also be stored in a vertical posture by selecting proper values of magnetic forces of the magnets 68, which are disposed in the pallet base 61.

The invention claimed is:

1. A pallet for fixing a plurality of board-like works, the pallet being arranged on a table of a liquid applying apparatus, which applies a liquid by moving a nozzle for discharging the liquid and the table relatively to each other, wherein the pallet comprises
    a base having a work area in which a plurality of works are to be arranged in parallel to form plural work lines in a row direction and/or a column direction, and
    a holding plate for holding the works at both ends thereof, the holding plate having one or more windows which are positioned to make open central portions of the works arranged in the work area and having long sides in the row direction or the column direction, the long sides of each window are longer than the added length of the works arranged in the longitudinal direction of the window.

2. The pallet according to claim 1, wherein the work area is made up of plural rows, and the base has projections formed to project upward from a surface of the base, on which the works are placed, for partition between the rows of the work area, and an interval between the projections is slightly larger than a short side of one of the works.

3. The pallet according to claim 2, wherein the work area is made up of plural columns, and the base has column partitioning ribs formed to project upward from the surface of the base, on which the works are placed, for partition between the columns of the work area, and an interval between the ribs is slightly larger than a long side of one of the works.

4. The pallet according claim 2, wherein a surface of the holding plate, which is brought into contact with the ends of the works, is formed of an elastic member.

5. The pallet according to claim 2, wherein a cover covering the works placed in the work area is detachably attached to the base.

6. The pallet according to claim 2, wherein the base includes a magnet disposed in a surface thereof, which is brought into contact with the holding plate, and the holding plate is made of a metal having magnetic action or includes a magnet disposed at a position opposed to the magnet in the base.

7. The pallet according to claim 2, wherein the pallet has a positioning hole formed in a rear surface thereof and is demountably mounted to a predetermined position on the table of the liquid applying apparatus.

8. A liquid applying apparatus including a table provided with a positioning pin which is fitted to the positioning hole formed in the rear surface of the pallet according to claim 7.

9. A liquid applying apparatus including a table to which the pallet according to claim 2 is fixed.

10. The pallet according to claim 2, wherein the windows are substantially rectangle-shaped.

11. The pallet according to claim 1, wherein the work area is made up of plural columns, and the base has column partitioning ribs formed to project upward from the surface of the base, on which the works are placed, for partition between the columns of the work area, and an interval between the ribs is slightly larger than a long side of one of the works.

12. The pallet according to claim 1, wherein a surface of the holding plate, which is brought into contact with the ends of the works, is formed of an elastic member.

13. The pallet according to claim 1, wherein a cover covering the works placed in the work area is detachably attached to the base.

14. The pallet according claim 1, wherein the base includes a magnet disposed in a surface thereof, which is brought into contact with the holding plate, and the holding plate is made of a metal having magnetic action or includes a magnet disposed at a position opposed to the magnet in the base.

15. The pallet according to claim 1, wherein the pallet has a positioning hole formed in a rear surface thereof and is demountably mounted to a predetermined position on the table of the liquid applying apparatus.

16. A liquid applying apparatus including a table provided with a positioning pin which is fitted to the positioning hole formed in the rear surface of the pallet according to claim 15.

17. A liquid applying apparatus including a table to which the pallet according to claim 1 is fixed.

18. The pallet according to claim 1, wherein the windows are substantially rectangle-shaped.

19. A pallet for fixing a plurality of board-like works, the pallet being arranged on a table of a liquid applying apparatus, which applies a liquid by moving a nozzle for discharging the liquid and the table relatively to each other, wherein the pallet comprises
   a base having a work area in which a plurality of works are to be arranged in parallel to form plural work lines in a row direction and/or a column direction, and
   a holding plate for holding the works at both ends thereof, the holding plate having one or more windows which are positioned to make open central portions of the works arranged in the work area and to make open successively in the row direction or the column direction,
   wherein between two projections which are located adjacent to one of the works, a recess is formed to be hollowed to a lower level than the surface of the base, on which the works are placed, and a length of the recess in the column direction is larger than a side of the projection in the column direction.

20. A pallet for fixing a plurality of board-like works, the pallet being arranged on a table of a liquid applying apparatus, which applies a liquid by moving a nozzle for discharging the liquid and the table relatively to each other, wherein the pallet comprises
   a base having a work area in which a plurality of works are to be arranged in parallel to form plural work lines in a row direction and/or a column direction, and
   a holding plate for holding the works at both ends thereof, the holding plate having one or more windows which are positioned to make open central portions of the works arranged in the work area and to make open successively in the row direction or the column direction,
   wherein the work area is made up of plural rows, and the base has projections formed to project upward from a surface of the base, on which the works are placed, for partition between the rows of the work area, and an interval between the projections is slightly larger than a short side of one of the works, and
   wherein between two projections which are located adjacent to one of the works, a recess is formed to be hollowed to a lower level than the surface of the base, on which the works are placed, and a length of the recess in the column direction is larger than a side of the projection in the column direction.

\* \* \* \* \*